(12) United States Patent
Spanier et al.

(10) Patent No.: US 10,749,056 B2
(45) Date of Patent: Aug. 18, 2020

(54) METHOD FOR MAKING FERROELECTRIC MATERIAL THIN FILMS

(71) Applicants: Drexel University, Philadelphia, PA (US); The Trustees of the University of Pennsylvania, Philadelphia, PA (US)

(72) Inventors: Jonathan E. Spanier, Bala Cynwyd, PA (US); Peter K. Davies, Newtown, PA (US); Andrew M. Rappe, Penn Valley, PA (US); Liyan Wu, Philadelphia, PA (US); Andrei R. Akbasheu, Mountain View, CA (US); Ilya Grinberg, Fairlawn, NJ (US)

(73) Assignee: Drexel University, Philadelphia, PA (US)

( * ) Notice: Subject to any disclaimer, the term of this patent is extended or adjusted under 35 U.S.C. 154(b) by 296 days.

(21) Appl. No.: 15/430,135

(22) Filed: Feb. 10, 2017

(65) Prior Publication Data

US 2017/0236955 A1 Aug. 17, 2017

Related U.S. Application Data

(60) Provisional application No. 62/294,010, filed on Feb. 11, 2016.

(51) Int. Cl.
*H01L 31/032* (2006.01)
*C23C 14/08* (2006.01)
(Continued)

(52) U.S. Cl.
CPC .......... *H01L 31/032* (2013.01); *C04B 35/495* (2013.01); *C04B 35/6261* (2013.01); *C04B 35/6262* (2013.01); *C04B 35/62675* (2013.01);
*C04B 35/62685* (2013.01); *C23C 14/088* (2013.01); *C23C 14/3414* (2013.01); *C04B 2235/3201* (2013.01); *C04B 2235/3215* (2013.01); *C04B 2235/3251* (2013.01);
(Continued)

(58) Field of Classification Search
CPC ..................................... H01L 31/032
See application file for complete search history.

(56) References Cited

U.S. PATENT DOCUMENTS 6,177,151 B1   1/2001   Chrisey et al.
8,372,469 B2   2/2013   Eriksson et al.
(Continued)

FOREIGN PATENT DOCUMENTS

WO   WO2008073529 A2   6/2008

OTHER PUBLICATIONS

Akbashev et al., "Process for producing complex oxide semiconducting ferroelectric thin film materials and photovoltaic devices," 2013, Drexel University and University of Pennsylvania (Year: 2013).*

(Continued)

*Primary Examiner* — Robert A Vetere
(74) *Attorney, Agent, or Firm* — Mendelsohn Dunleavy, P.C.

(57) ABSTRACT

A method of growing a FE material thin film using physical vapor deposition by pulsed laser deposition or RF sputtering is disclosed. The method involves creating a target to be used for the pulsed laser deposition in order to create a KBNNO thin film. The resultant KBNNO thin film is able to be used in photovoltaic cells.

18 Claims, 18 Drawing Sheets

(51) Int. Cl.
  *C23C 14/34* (2006.01)
  *C04B 35/495* (2006.01)
  *C04B 35/626* (2006.01)

(52) U.S. Cl.
  CPC ............... *C04B 2235/3255* (2013.01); *C04B 2235/3279* (2013.01); *C04B 2235/443* (2013.01); *C04B 2235/604* (2013.01); *C04B 2235/6587* (2013.01); *C04B 2235/761* (2013.01); *C04B 2235/768* (2013.01)

(56) References Cited

U.S. PATENT DOCUMENTS

| | | | |
|---|---|---|---|
| 8,434,856 B2 | 5/2013 | Sakashita et al. | |
| 2006/0288928 A1 | 12/2006 | Eom et al. | |
| 2012/0213964 A1 | 8/2012 | Goyal et al. | |
| 2013/0075377 A1* | 3/2013 | Cheng | H01L 31/0392 219/121.85 |
| 2013/0104969 A1* | 5/2013 | Rappe | H01L 31/032 136/255 |
| 2013/0234564 A1 | 9/2013 | Sakashita et al. | |

OTHER PUBLICATIONS

Patro, "Phase Evolution, Densification and Dielectric Properties of [KNbO3]1-x[BaNi½Nb½O3-δ]x[x=0.1,0.2] Ferroelectric Ceramics Prepared by Conventional Sintering and Spark Plasma Sintering," 2015, Rourkela National Institute of Technology. (Year: 2015).*

Acker et al., "Microstructure of sodium-potassium niobate ceramics sintered under high alkaline vapor pressure atmosphere", 2014, J. European Ceram. Soc., 34, pp. 4213-4221. (Year: 2014).*

Akbashev, A. R., et al., "Process for Producing Complex Oxide Semiconducting Ferroelectric Thin Film Materials and Photovoltaic Devices," Drexel University and University of Pennsylvania, 2013, 10 pages.

Akbasheu, A. "Synthesis and Properties of Ferroelectric Perovskite Oxide Thin Films." Diss. Drexel University, 2015, 150 pages.

Grinberg, Ilya, et al. "Perovskite oxides for visible-light-absorbing ferroelectric and photovoltaic materials." Nature 503.7477 (2013): 509-512.

* cited by examiner

METHOD FOR MAKING FERROELECTRIC MATERIAL THIN FILMS

RELATED APPLICATION DATA

This application claims priority to U.S. Provisional Application No. 62/294,010, filed Feb. 11, 2016, the entire disclosure of which is hereby incorporated by reference as if set forth fully herein.

STATEMENT OF GOVERNMENTAL INTEREST

This invention was made with government support under Grant No. W911NF-08-1-0067 awarded by the U.S. Army Research Office. The government has certain rights in the invention.

BACKGROUND OF THE INVENTION

1. Field of the Invention

The present invention is directed to the field of photovoltaic cells. In particular the invention is directed to the use of ferroelectric material in photovoltaic cells.

2. Description of the Related Technology

Renewable energy sources are important to obtain. In the search for new routes to renewable energy sources, much attention is focused on the fabrication of new environmentally-friendly and chemically stable materials with desired functional properties. One such promising energy source is solar energy.

To harvest solar energy, photovoltaic materials may be used that can absorb light in the whole UV and visible spectral range. In order to accomplish this, photovoltaic materials having a small band gap of less than 2.5 eV may be used. Preferably these materials also show an efficient solar energy conversion.

Currently the most popular material to use in photovoltaic cells and modules is bulk single-crystalline silicon which must be used with dopant atoms to create the photovoltaic cells. Since silicon is an indirect band-gap material, approximately a 100 times larger thickness of silicon is required compared with direct band-gap materials to achieve comparable absorption of the solar spectrum. Further the process for making the photovoltaic cells using these materials requires formation of a p-n junction, or interface between two different regions having different doping. Also despite the length of time these materials have been around, there has been little improvement in their efficiency.

Among thin-film technologies, CdTe and CuInGaSe (CIGS) and related materials and their combinations are the current incumbent choices for thin-film inorganic solar cells and modules. They are attractive because they are direct band gap materials; however each of these materials is relatively expensive compared with silicon and also requires formation of a p-n junction. Further, Cd is known to be toxic.

SUMMARY OF THE INVENTION

An aspect of the present invention is a ferroelectric material thin film that may be used in photovoltaic devices that is made by the method of the present invention.

An aspect of the present invention may be a method of making a ferroelectric thin film for a photoelectric device comprising vaporizing a target. The method further comprises growing a thin film from the vaporized target on the surface of a substrate, wherein the grown thin film comprises $a(1-x)KNbO_3-xBaNb_{0.5}Ni_{0.5}O_3$ (KBBNO) material.

Another aspect of the present invention may be a method a making a photovoltaic cell comprising striking a target with a laser beam. The method further comprises growing a thin film on a substrate with material from the struck target, wherein the material comprises $(1-x)KNbO_3-xBaNb_{0.5}Ni_{0.5}O_3$(KBNNO); and forming a photovoltaic cell comprising the thin film.

In another aspect, the invention relates to a photovoltaic cell made by the foregoing method.

Still another aspect of the present invention may be a method a making a ferroelectric material for a photoelectric device comprising the step of vaporizing a target. The method may further comprise growing a thin film using a ferroelectric material on a substrate, wherein the ferroelectric material is vaporized from the target and wherein the substrate is lattice mismatched with respect to the grown thin film.

Still another aspect of the present invention relates to a method of making a ferroelectric material for a photoelectric device comprising a step of growing via metalorganic chemical vapor or atomic layer deposition (ALD) from metalorganic precursors a thin film on a substrate; wherein the thin film comprises a $(1-x)KNbO_3-xBaNb_{0.5}Ni_{0.5}O_3$ (KBNNO); material. In this method the substrate may have a temperature between possible between 400 to 800° C. In each of these two embodiments of the method, the atmospheric pressure surrounding the substrate may be between 0.1 mTorr to 75 mTorr.

DETAILED DESCRIPTION OF THE PREFERRED EMBODIMENT(S)

Figure 1:
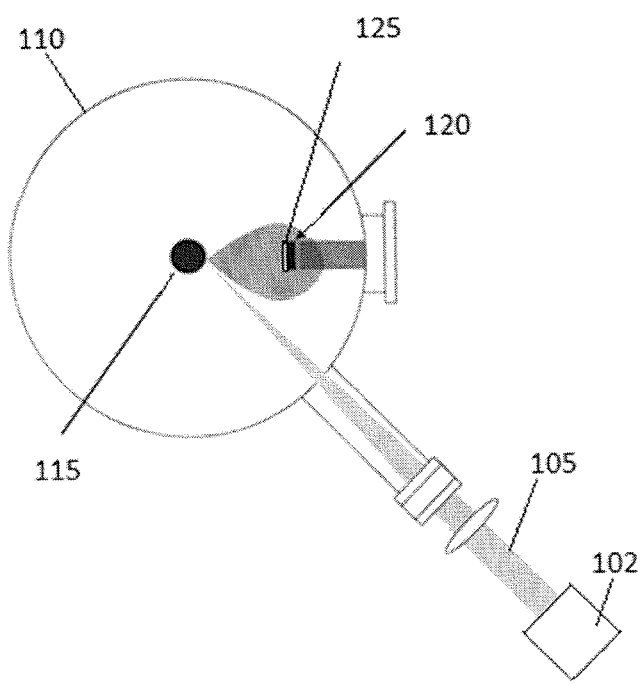
FIG. 1 is a simplified schematic diagram of a set-up for a pulsed laser deposition process.

For illustrative purposes, the principles of the present disclosure are described by referencing various exemplary embodiments. Although certain embodiments are specifically described herein, one of ordinary skill in the art will readily recognize that the same principles are equally applicable to, and can be employed in other systems and methods.

Before explaining the disclosed embodiments of the present disclosure in detail, it is to be understood that the disclosure is not limited in its application to the details of any particular embodiment shown. Additionally, the terminology used herein is for the purpose of description and not of limitation. Furthermore, although certain methods are described with reference to steps that are presented herein in a certain order, in many instances, these steps may be performed in any order as may be appreciated by one skilled in the art; the novel methods are therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more" and "at least one" can be used interchangeably herein. The terms "comprising", "including", "having" and "constructed from" can also be used interchangeably.

In photovoltaics, a cheaper and more efficient material is sought for use in making photovoltaic cells. Ferroelectric (FE) materials offer a new avenue to explore as a possibly cheaper and more efficient material to use. FE materials have benefits and issues. The non-centrosymmetric crystal structure of FE materials breaks the symmetry of the momentum distribution for non-equilibrium, i.e. photo-excited, electrons in the form of an electronic excitation formed by entanglement of an electron, hole and photon. This is one way for optically-generated current to flow in one direction inside the FE material, resulting in the bulk photovoltaic effect (BPVE). Equally significant, the internal electric field of the FE material arising from the depolarization field can easily separate light-generated excitons. Finally, FE domain walls result in gradients in FE polarization, and therefore electrostatic potential. The above factors are expected to provide open-circuit photovoltages in FE materials for photovoltaic cells that are larger than those reported in materials that are not ferroelectric. Also poor light absorption, limited by the large band gap (~3 eV) of many FE materials may lead to a low quantum efficiency of photovoltaic cells based on FE materials.

Until now, very few FE materials have been identified as good candidates for making photovoltaic cells. Among them the most promising FE material has been $BiFeO_3$ with a band gap of ~2.7 eV. However, $BiFeO_3$ in a thin film state shows a value of external quantum efficiency (EQE) above 2% only for photons with a wavelength of less than 450 nm. This misses most of the solar energy in the visible spectral region therefore making $BiFeO_3$ in a thin film state an unsuitable candidate for a photovoltaic cell.

Recently, the theoretical prediction and synthesis of a new FE material $(1-x)KNbO_3-xBaNb_{0.5}Ni_{0.5}O_3$ (KBNNO) has been accomplished. KBNNO has a band gap that varies depending on the value of x. The smallest band gap found for this solid solution with FE ordering was ~1.4 eV when x=0.1. This is relatively close to the band gaps of GaAs, Si, CdTe and CIGS which are used as key materials in modern solar cell technologies.

Further investigation of the narrow band gap (between 1.0 eV-3.8 eV) FE material, KBNNO, and its applicability in photovoltaic cells involves the synthesis of thin films that can be utilized in photovoltaic cells that have a similar composition to KBNNO. By thin films it is meant that the film has a thickness of between 15 nm to 1 micron. The thickness is measured from the surface of the thin film facing the surface of a substrate on which it may be grown to the surface of the thin film facing outwards. The deposited material used to grow the thin films need not be planar, but can be nanostructured, e.g. a conformally coated layer.

FE material that is illuminated with an increased polarization without any change in its band gap produces larger open-circuit photovoltages along the polarization direction. This means that the FE material has a higher power conversion efficiency, thus making it better for use as a photovoltaic cell. The enhancement of the FE polarization may be achieved via in-plane strain caused by epitaxial growth of the FE material on a lattice-mismatched substrate. A lattice-mismatched substrate is a substrate wherein the in-plane lattice parameter of the thin film differs from the in-plane lattice parameter of the lower substrate by some non-zero amount from between about −5% to about 5%. Epitaxially growing FE material on a lattice-mismatched substrate can improve the photovoltaic properties of an FE material, such as, for example, the KBNNO material. Accomplishing the epitaxial growth of KBNNO is a challenging process that is described in further detail below.

Growth of an FE material on a substrate is now discussed herein with reference to exemplary embodiments of the present invention. In the exemplary embodiments FE material may be grown on substrates using a physical vapor deposition process such as pulsed laser deposition (PLD). The PLD process would typically not be used to form thin films out of KBNNO due to the complexity and difficulty that is typically encountered in the formation of thin films having a composition such as KBNNO.

FIG. 1 is a simplified schematic of a set-up for the PLD process. The PLD process is a process where laser 102 transmits a pulsed laser beam 105 inside a vacuum chamber 110 to strike a target 115 that comprises a material that is to be grown on a substrate 120. The power of the laser beam should be such that it causes vaporization of the target. The struck target 115 is then vaporized and the material is grown by deposition as a thin film 125 on the substrate 120.

Other physical vapor deposition methods, similar to PLD may be used, such as RF sputtering. RF sputtering delivers an ion beam to a target that is made in accordance with an embodiment of disclosure. Further, thin films may also be formed via metalorganic chemical vapor or atomic layer deposition (ALD) from metalorganic precursors, such as (a) tris (1-methoxy-2methyl-2-propoxy)bismuth $(Bi(mmp)_3)$, tris (2,2,6,6-tetramethyl-3,5-heptanedionato)bismuth$(Bi(thd)_3)$ and $Bi(N(Si(CH_3)_3)_2)_3$. Other precursors may be potassium tertbutoxide, K-dipvaloylmethane pentaethoxyniobium. In ALD, initial deposition of the film may result in an amorphous structure, requiring subsequent annealing to form the correct thin film structure and stoichiometry. Also the formation of thin films using sol-gel methods involving metalorganic precursors may be used.

In embodiments of the present invention, KBNNO thin films were grown on different substrates using the PLD process. The growth of the KBNNO thin films using the PLD process involved a complex process requiring control of a number of parameters involved in the formation of the targets and the process of growing the FE material. For example, some conditions that had to be determined and controlled were the following; (1) the composition of the targets to be struck and vaporized (2) the composition of the substrates on which the vaporized target material would be grown; (3) the temperature at which the substrate would be maintained during the process; (4) the power, frequency and wavelength of the laser that would be used to strike the target; (5) the appropriate distance between the target to be struck and the substrate on which the vaporized target material would be grown and (6) environmental factors surrounding the laser, target and substrate that would impact the growth of the target material on the substrate to form the thin film.

In the embodiments disclosed herein, KBNNO thin films were grown on substrates comprising single-crystalline (001)-oriented $SrTiO_3$ or glass ($SiO_2/Si(100)$). Potentially other materials such as a conducting metallic material to create a bottom electrode may be comprised in the substrate. Also other $ABO_3$ perovskites such as $DyScO_3$, (La,Sr)(Al,Ta)$O_3$, oxides such as MgO, $ZrO_2$, etc. or $SiO_2/Si(100)$, glass, or Si of any common crystallographic orientation, e.g. (001), (110), (111) may be used as the substrate. The thin film may also be grown on substrates comprising electrically conductive or metallic perovskite, non-perovskite substrates such as Nb-doped $SrTiO_3$, electrically conductive or metallic films, perovskites such as $SrRuO_3$, $LaNiO_3$ or others, and non-perovskite oxides, such as oxides of noble or transition metal elements or alloys.

The PLD process was performed with a KrF laser having a wavelength of 248 nm. The energy density of the laser was ~200 mJ and the laser frequency was 3-5 Hz. It should be understood that other lasers may be used depending on the environmental condition of the target and the energy needed to vaporize the target. For example the energy density of the laser may be between 10 mJ and 10 J, more preferably between 100 mJ and 800 mJ.

In the PLD process the laser beam was focused on the targets. The targets had 50 mol. % of KBNNO mixed with 50 mol. % of $KNO_3$. The distance between the target and the substrate was from 5 to 6 cm. The distance between the target and the substrate may be between 1 to 15 cm, more preferably between 2 to 10 cm and most preferably between 4-8 cm. The oxygen pressure was varied from 20 to 100 mTorr and the temperature of the substrate was varied from 600 to 700° C. Further, in order to perform electrical, piezo-response and photovoltaic measurements, a 15 nm layer of a $SrRuO_3$ electrode was deposited on top of the $SrTiO_3$ substrate (or $SiO_2/Si(100)$ substrate) prior to the growth of the KBNNO thin film on the substrates.

The results of the PLD process were analyzed using a variety of tools. The chemical compositions of the grown thin films were checked by energy-dispersive X-ray spectroscopy (EDS) and X-ray fluorescence (XRF) spectroscopy. The morphology of the resultant thin film was further studied using scanning electron microscope (SEM) Zeiss Supra 50VP and an atomic force microscope. Transmission electron microscopy (TEM) of the thin film was performed using a JEOL JEM2100 microscope. The determination of the phase composition as well as establishment of epitaxial relations was carried out using Rigaku Smartlab X-ray diffractometer using Cu $K_\alpha$ radiation. Atomic force microscopy and piezoresponse force microscopy were used to show that the thin film grown by the PLD process exhibits FE switching at 300 K under ambient pressure. Further tests on the thin films using Raman spectroscopy were performed using a Renishaw RM2000 UV Raman Microspectrometer at room temperature.

Creating the targets used in the PLD process is also a process that involves a number of parameters to ensure that the resultant thin film is suitable for use in photovoltaic devices. The targets used in the PLD process may be formed by different processes and in performing the present PLD process discussed above, targets were made in accordance with the processes disclosed below. It should be understood that the different processes for making the targets disclosed herein may be used in other vapor deposition methods, such as RF sputtering.

Figure 2:
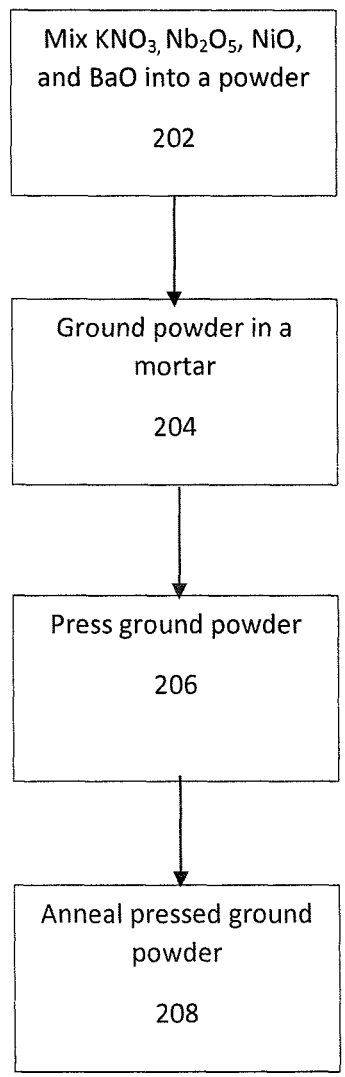
FIG. 2 is a flow chart showing a process for forming a target for use in making a thin film in accordance with an embodiment of the present disclosure.

Now referring to FIG. 2, in a first process, the target used in the PLD process comprised KBNNO pellets that may be made via several solid state chemical approaches. In step 202, the powders of $KNO_3$, $Nb_2O_5$, NiO, and BaO are mixed in a stoichiometric ratio of $KBNNO+KNO_3$. In step 204, the mixed powder is ground in a mortar. In step 206, the ground powder is pressed under ~200 MPa pressure. In step 208, the pressed ground powder is annealed in a furnace at temperatures between 800-1200° C. for 6-12 hours to create a first target for the PLD process.

Figure 3:
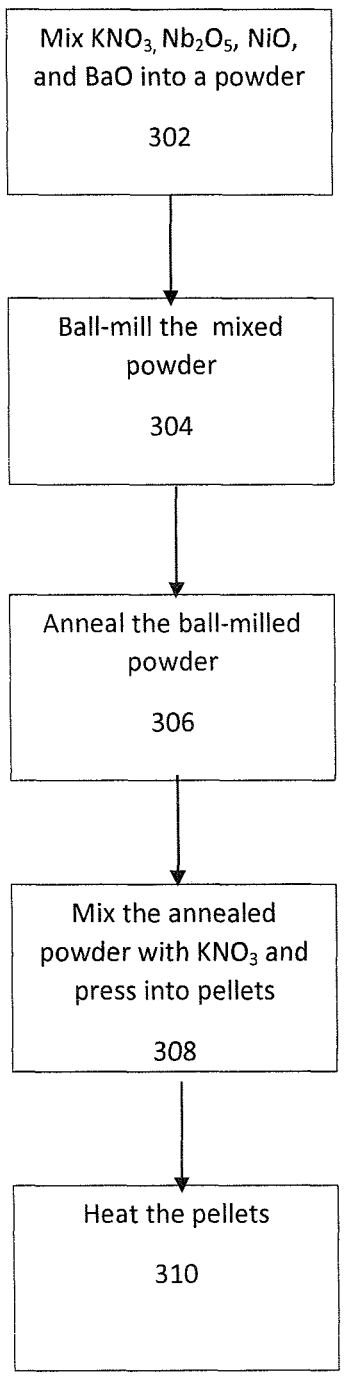
FIG. 3 is a flow chart showing another process for forming a target for use in making a thin film in accordance with an embodiment of the present disclosure.

Referring now to FIG. 3, another process for creating the targets used in the PLD process is shown. In step 302, the same powders as discussed above with respect to step 202 are mixed for the KBNNO thin film synthesis. In step 304, the mixed powder is ball-milled. In step 306, the resulting ball-milled powder is then annealed at a temperature of 900° C. for 12 hours and then 1050-1250° C. for 3-12 hours. In step 308, the annealed ball-milled powder is then mixed with $KNO_3$ for the potassium excess and pressed into pellets. In step 310, when the amount of $KNO_3$ was 50% or less, the pellets were heated to ~500-600° C. for ~1-2 hours in order to make them less fragile. For compositions with more than 50 mol. % of $KNO_3$ the pellets were heated to ~300° C. prior to using them in the PLD process.

Figure 4:
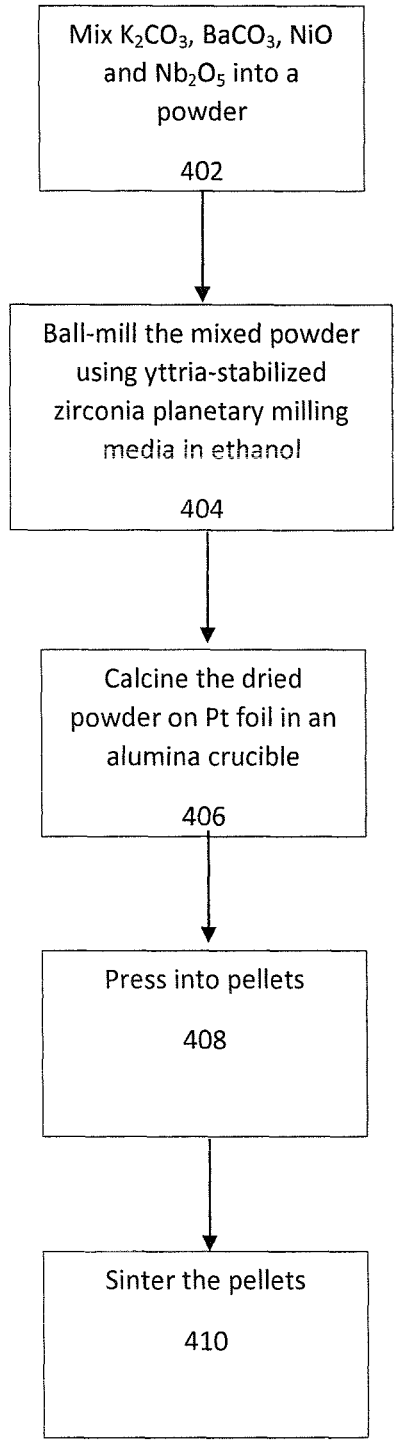
FIG. 4 is a flow chart showing another process for forming a target for use in making a thin film in accordance with an embodiment of the present disclosure.

Referring now to FIG. 4, in another process for creating the targets, in step 402, the targets are made by mixing stoichiometric quantities of dried $K_2CO_3$, $BaCO_3$, NiO and $Nb_2O_5$ powders. In step 402, after mixing in a mortar, the mixed powder is ball-milled using yttria-stabilized zirconia planetary milling media in ethanol for 2 hours. In step 406, the dried powder is calcined on Pt foil in an alumina crucible at a temperature between 700-1100° C. for 12 hours. The pellets are placed on Pt foil and in a covered alumina crucible, then surrounded by sacrificial powder of the same composition to inhibit volatilization of potassium. In step 408, aliquots, each of which are approximately 300 mg, are pressed into 0.25 ml pellets in a uniaxial press and isostatically pressed at 80,000 psi. In step 410, the pellets are sintered at temperatures between 1050-1250° C., depending on the overall composition.

When making targets in accordance with the processes discussed above, to minimize any absorption of $H_2O$, which may be an issue in the synthesis of $KNbO_3$, at all stages of the synthesis, targets may be either kept at elevated temperature (at least 200° C.) or placed in a dessicator to minimize their exposure to moisture.

Also, when preparing pellets of $[KNbO_3]_{1-x}$ $[BaNi_{1/2}Nb_{1/2}O_{3\text{-}delta}]_x$ composition for use as targets, additional KNO$_3$ material may be added for correction to grow a final thin film with the appropriate composition. An exemplary stoichiometric ratio of the targets is the following, for x=0.1: (For K$_{0.9}$Ba$_{0.1}$Nb$_{0.95}$Ni$_{0.05}$O$_3$+KNO$_3$; KNO$_3$:Nb$_2$O$_5$:BaO: NiO=(1.9):(0.475):(0.1):(0.05). For Nb$_2$O$_5$, 0.95 is divided by 2 because Nb$_2$O$_5$ has 2 Nb per mole.

In creating the KBNNO thin films the thickness of the resultant films will play a role in the optical absorption of the thin film and the depolarizing field that is associated with the FE polarization. Preferably, the thickness of the thin film is such that these two opposing qualities are counterbalanced. As the thickness is reduced, the total amount of absorbed light is reduced, reducing the ultimate efficiency of conversion of light to photovoltage. However, as the film thickness is reduced the beneficial effect of the depolarizing field, a finite potential difference acting across a thinner film, increases. Thus a selected value of film thickness for a given FE material and electrode materials, which also influences the depolarizing field, leads to an optimal film thickness value for desired power conversion efficiency.

Figure 5:
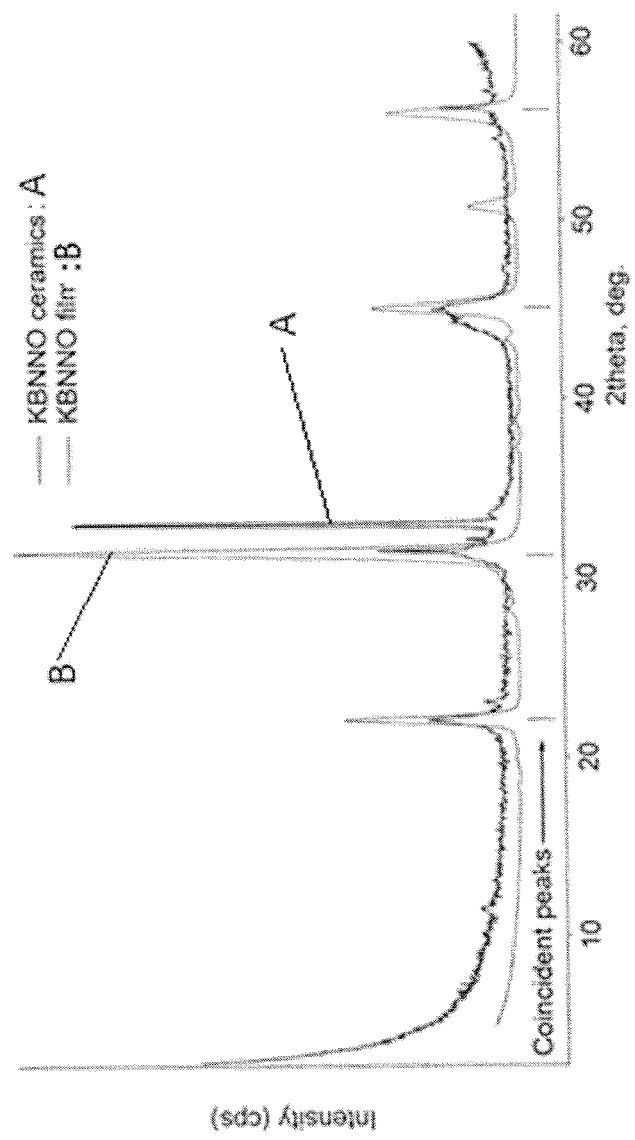
FIG. 5 shows an x-ray diffraction pattern of a KBNNO thin film grown on a silicon wafer substrate.

In developing the KBNNO thin films and processes discussed above, the initial thin film growth experiments were performed on a Si wafer substrate with a SiO$_2$ layer of less than 10 nm in thickness. FIG. 5 shows the X-ray diffraction (XRD) results of bulk ceramic KBNNO shown by the line A and XRD results of thin film KBNNO shown by the line B. The XRD results revealed that the polycrystalline thin film had similar X-ray reflections as bulk ceramic KBNNO. These results demonstrate the feasibility of obtaining well-oriented semiconductor ferroelectrics on inexpensive glass substrates.

Figure 6:
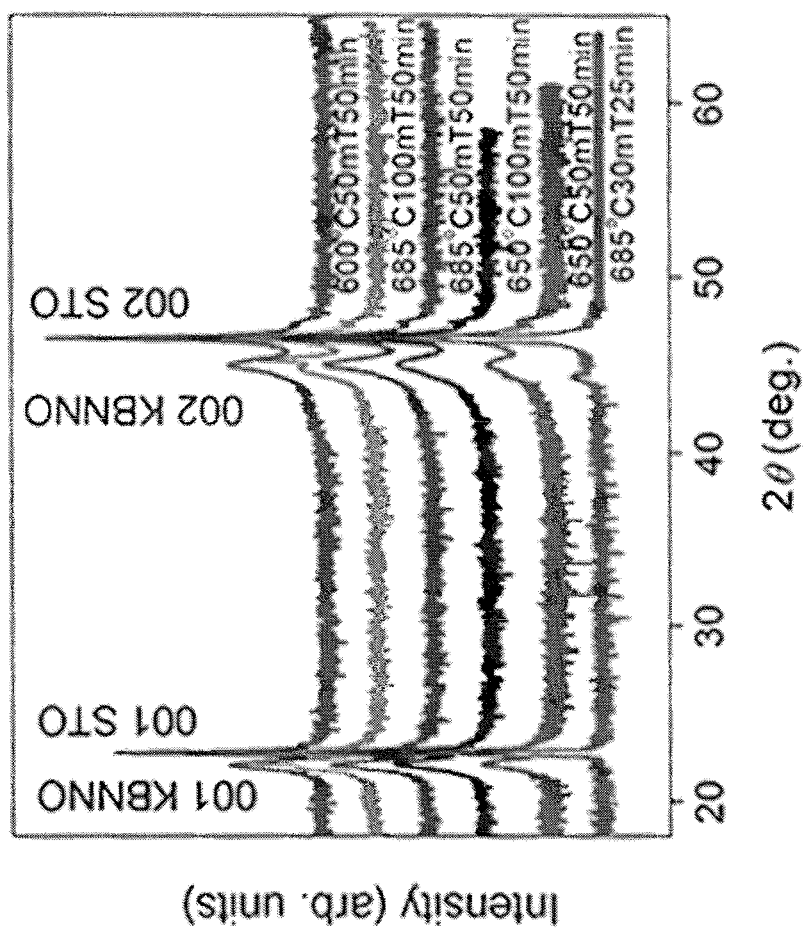
FIG. 6 shows x-ray diffraction patterns of KBNNO thin films grown under different conditions.

Other factors that played a role in successfully growing the thin films were atmospheric pressure and temperature of the substrate on which the thin film is grown. A possible range for the atmospheric pressure is 0.001 mTorr to 100 mTorr, a more preferable range is 0.1 mTorr to 75 mTorr. A possible range for the temperature of the substrate is between 50 to 900° C., a preferred range may be between 400 to 800° C. and more preferred range is between 500 to 700° C. The growth on perovskite STO(001) substrates was performed for different p(O$_2$)-T conditions in order to both find the best growth conditions and determine the influence of these conditions on the growth process and the quality of the resultant thin film. In FIG. 6 the XRD patterns of thin films grown under different conditions are shown. Only a series of (001) reflections of KBNNO on the 2θ/ω (out-of-plane) scans can be seen. The results shown in FIG. 6 illustrate that the thin films are highly oriented. FIG. 6 also shows that the best quality thin films were obtained when p(O$_2$)≈50 mTorr and the temperature was about 650-685° C. Therefore, for further experiments 50 mTorr of O$_2$ pressure and 650° C. were chosen for growth parameters sufficient for the crystallization of the thin film without much loss of potassium of which it is composed.

Figure 7:
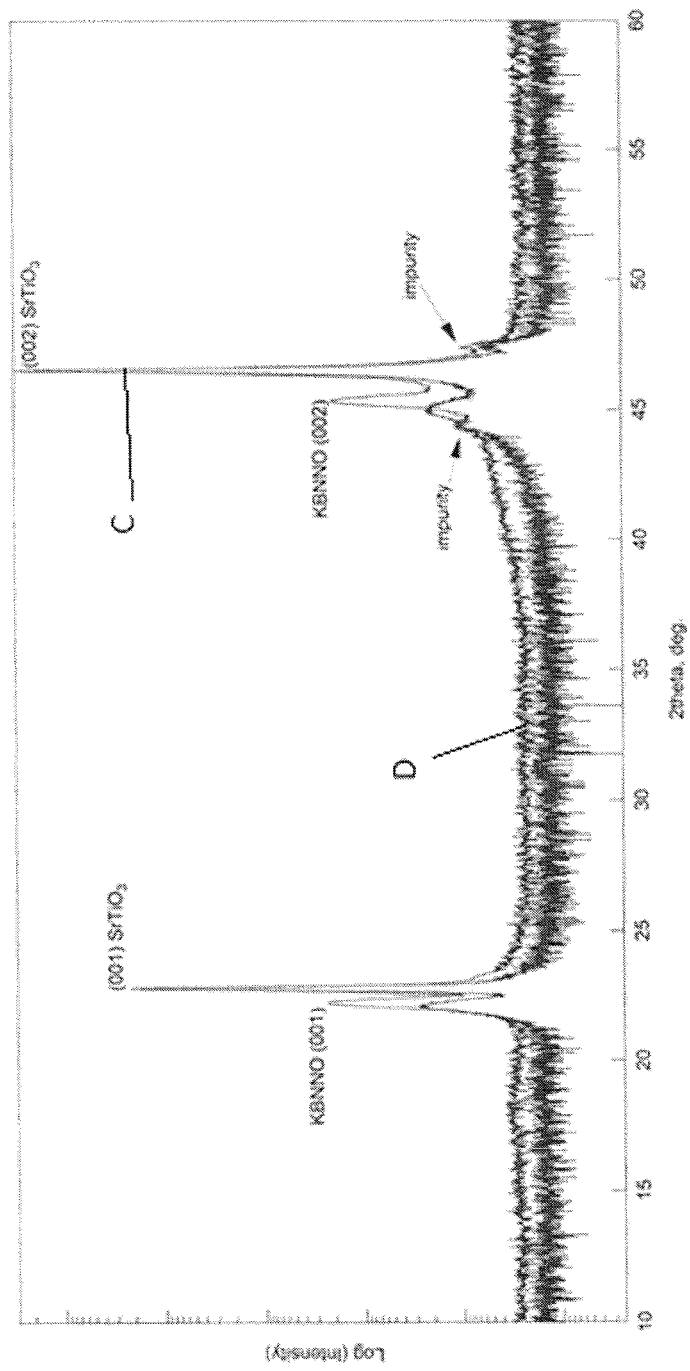
FIG. 7 shows x-ray diffraction patterns of K deficient thin films of different thicknesses.

FIG. 7 shows the role played by K-deficient impurity phases in the K—Nb—O system that appears in the thin film as a result of its non-stoichiometry due to potassium oxide evaporation during deposition. One of the main challenges for the growth of stoichiometric thin films is finding an efficient correction for potassium loss that may occur. To correct for potential potassium loss, KNO$_3$ was added to the KBNNO pellet and the proper amount of KNO$_3$ needed for the deposition of stoichiometric thin films was determined to be 50 mol. %.

A further factor that played a role in the growth of thin films was the difference in lattice-parameters between the thin film and the substrate. The difference in the lattice-parameter, c, between KBNNO thin films with different thickness may be determined from the XRD patterns shown in FIGS. 7 and 8B. This permits estimation of the tensile strain imposed by the substrate on the KBNNO perovskite structure. For example in FIG. 7, line C represents the XRD of a 15 nm thick thin film, while line D represents the XRD of a 50 nm thick thin film. In FIG. 8b, line E shows the high resolution 2θ/ω scan of the KBNNO near the reflection of STO of a 15 nm thick thin film, while line F shows the 2θ/ω scan of the KBNNO near the reflection of STO of a 40 nm thick thin film.

Figure 8A:
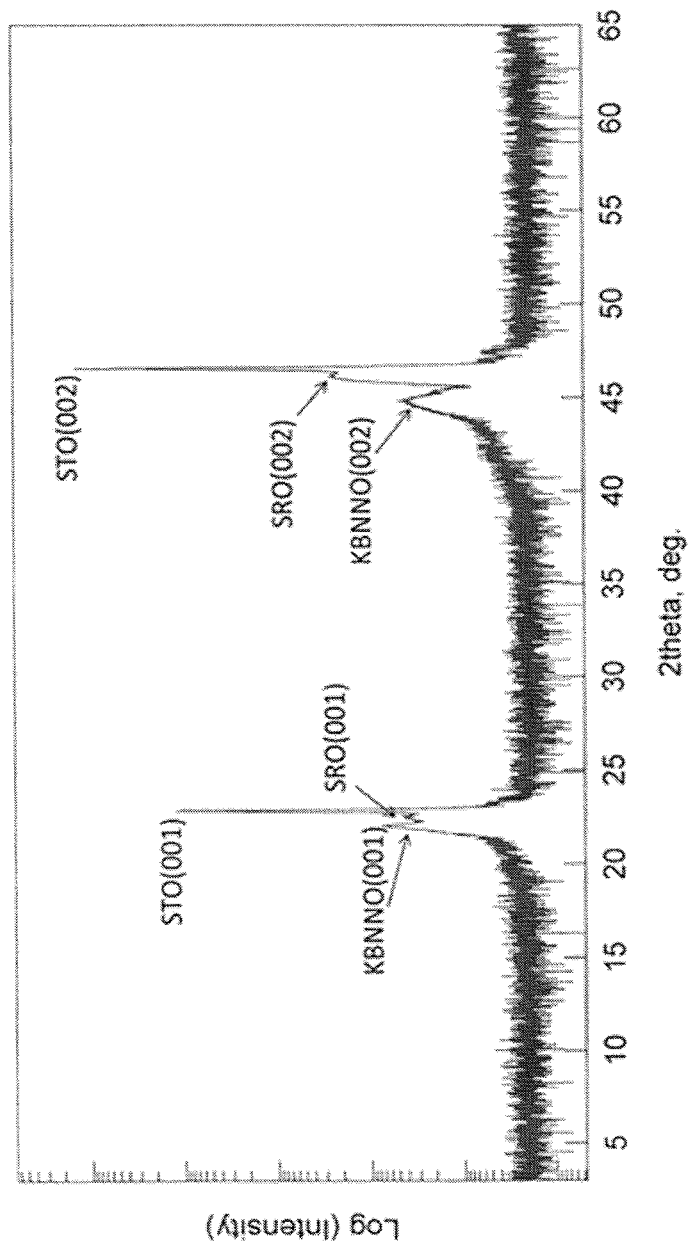
FIG. 8A shows an x-ray diffraction pattern of a KBNNO/SRO/STO heterostructure.
Figure 8B:
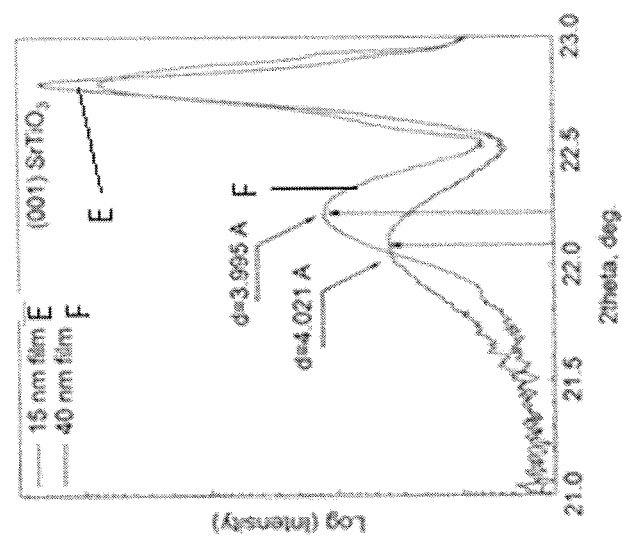
FIG. 8B shows a high-resolution 2θ/ω scan of the KBNNO thin film near the reflection of STO.
Figure 8C:
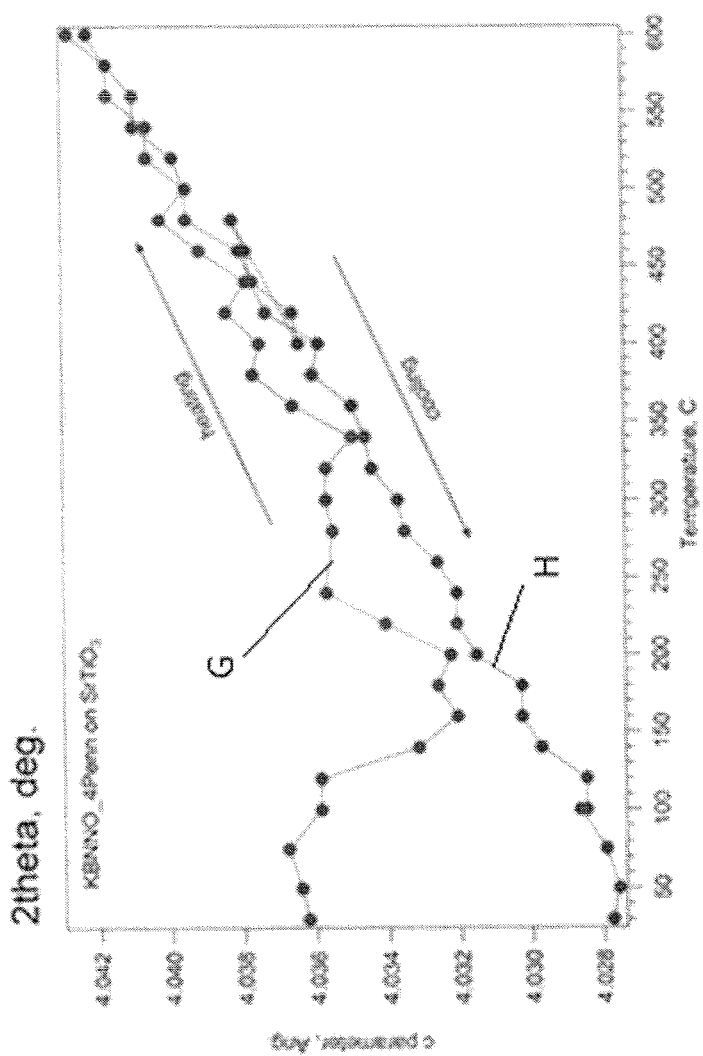
FIG. 8C is a graph showing the temperature dependence of the c lattice parameter of KBNNO on STO.

FIG. 8A shows the XRD pattern of a stoichiometric KBNNO thin film deposited on a bottom electrode SrRuO$_3$ (001). As discussed above, In FIG. 8B, line E shows the high resolution 2θ/ω scan of the KBNNO near the reflection of STO of a 15 nm thick thin film, while line F shows the 2θ/ω scan of the KBNNO near the reflection of STO of a 40 nm thick thin film. The temperature evolution of the c lattice parameter of the KBNNO/STO(001) film is shown in FIG. 8C, where line G represents heating and line H represents cooling. There appears to be a linear dependence (curve on cooling) without any visible anomaly that could suggest a ferroelectric to paraelectric transition.

Figure 9:
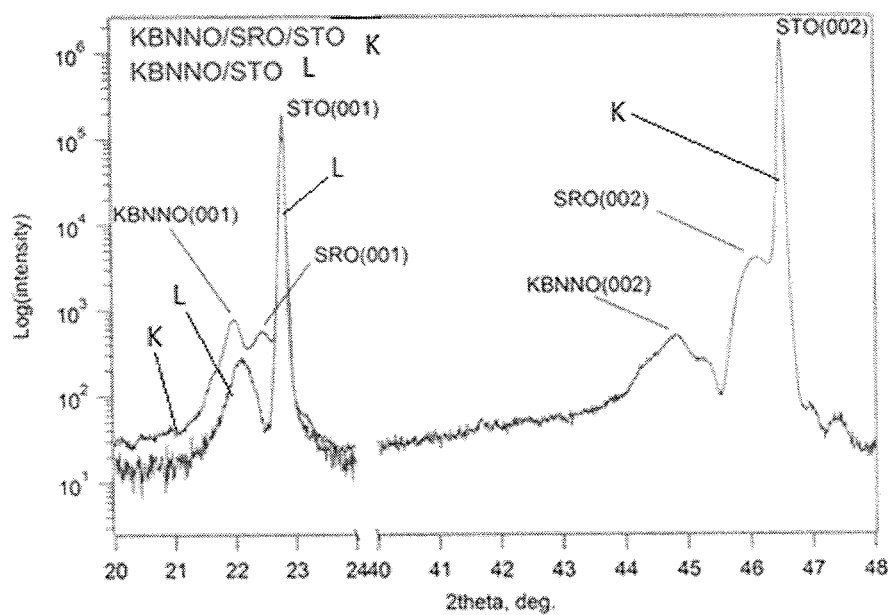
FIG. 9 shows the x-ray diffraction patterns of KBNNO thin films grown on a $SrRuO_3/SrTiO_3(001)$ and a $SrTiO_3$ substrate and on a $SiO_2/Si$ substrate.

In FIG. 9 a high-resolution XRD pattern for the KBNNO/SRO/STO heterostructure is shown, where line K represents the XRD results for a KBNNO/SRO/STO heterostructure and line L represents the XRD results for a KBNNO/STO heterostructure. In FIG. 9 reflectivity oscillations are visible around the (001) peaks of SRO.

Figure 10A:
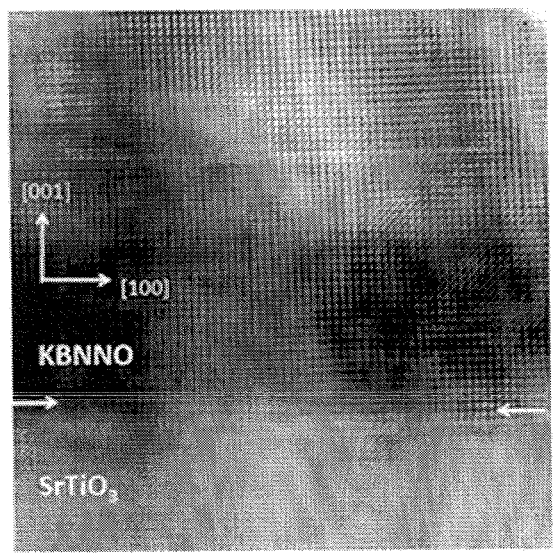
FIG. 10A shows a cross-section high resolution transmission electron microscopy image of a KBNNO thin film deposited on $SrTiO_3$ substrate via pulsed laser deposition.
Figure 10B:
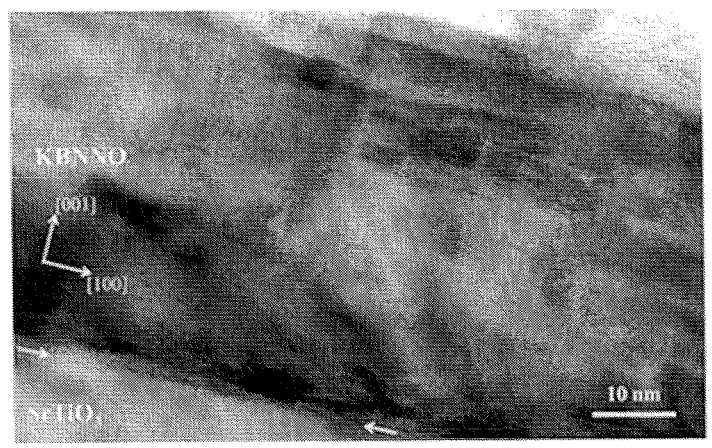
FIGS. 10B-10C show transmission electron microscopy images of KBNNO thin films grown on STO(001) substrates.
Figure 10C:
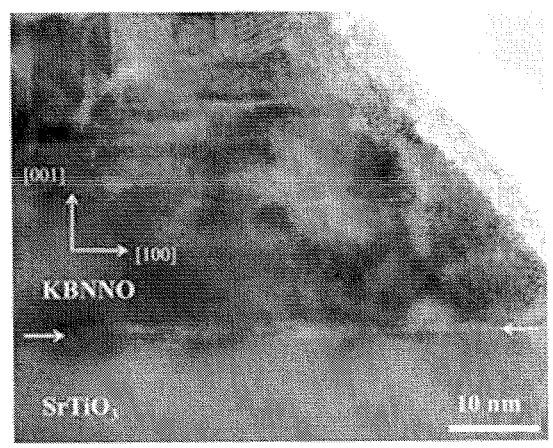

FIGS. 10A-10C show TEM images revealing epitaxial growth of KBNNO thin film on STO(001) without any noticeable impurity phases. Importantly, the structure of the films observed in FIGS. 10A-10C suggests "cube-on-cube" growth of the perovskite film, which resulted in the formation of cubic "nanograins" that are presumably separated by antiphase boundaries.

Figure 11A:
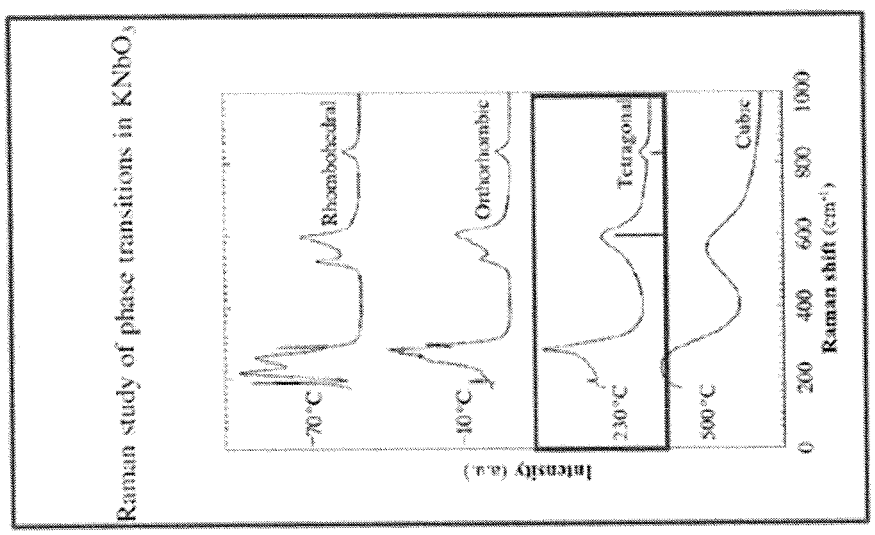
FIG. 11A shows a Raman study of phase transitions in $KBNO_3$.

Since the bulk a lattice-parameter of the tetragonal KBNNO with x=0.1 is 4.0 Å the epitaxial growth of (001) KBNNO thin film on the substrate with a slightly smaller in-plane lattice parameter should result in the increase of the c lattice constant of the (001) KBNNO thin film, thus allowing for a larger polarization along the <001> direction of the thin film. In experiments the lattice mismatch between a (001) KBNNO thin film and a SrTiO$_3$ substrate was ε=(a$_f$−a$_s$)/a$_f$=2-3%. Epitaxial strain is known to usually relax via the appearance of misfit dislocations that appear when the thin film reaches a certain thickness. To determine the epitaxial strain state of thin films, several thin films were grown with different thicknesses. To provide evidence that the crystal structure of the KBNNO thin films has a non-centrosymmetric structure that allows for ferroelectricity, UV Raman spectroscopy was performed as illustrated in FIGS. 11A and 11B.

The crystallographic phase of KNbO$_3$ is known to depend on the temperature and geometrical constraints imposed on the structure. As represented in FIG. 11A, above 708 K potassium niobate possesses a cubic crystal structure (Pm3m). Upon cooling, in the temperature range between 708 K and 498 K it changes to tetragonal (P4mm), then below 498 K to orthorhombic (Amm2) and finally below 263 K the structure becomes rhombohedral (R3m). Lowering of the symmetry of the KNbO$_3$ structure removes the degeneracy of the phonon modes, revealing additional peaks in Raman spectra. Since the determination of the symmetry of the crystal structure of the film generally requires a thorough and time-consuming XRD study, Raman spectroscopy is used for identifying the crystal structure of KBNNO thin film.

Figure 11B:
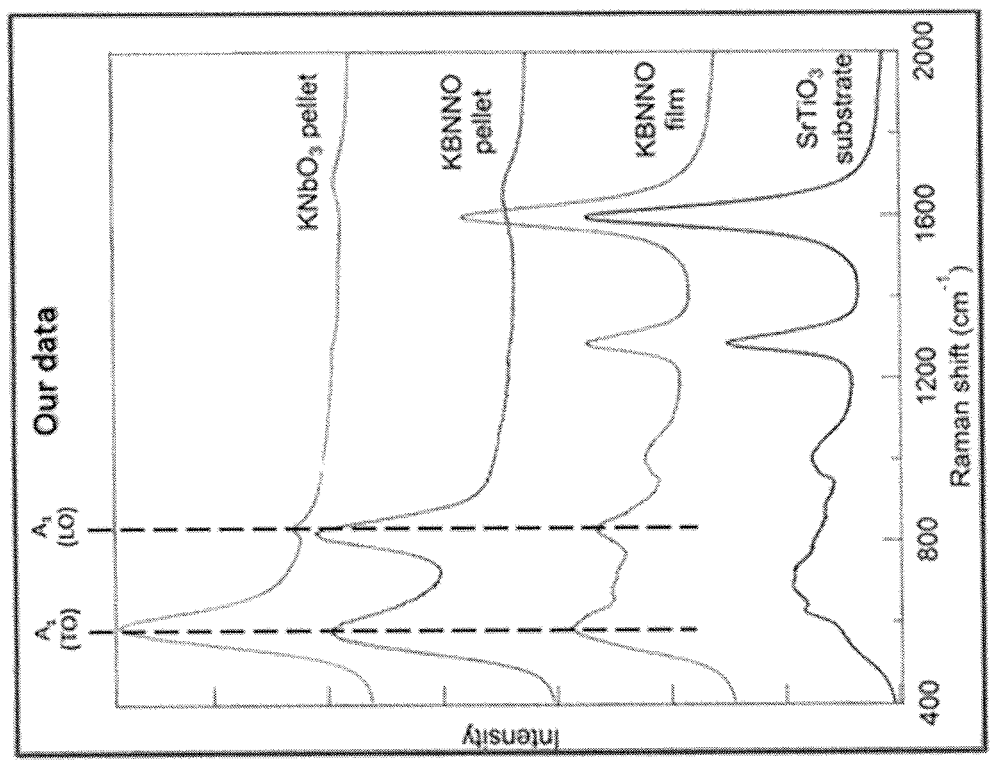
FIG. 11B shows a UV-Raman spectra of $KNbO_3$ (bulk), KBNNO (bulk), KBNNO (thin film) and $SrTiO_3$.

FIG. 11B shows the UV Raman spectra for a KNbO$_3$ ceramic polished pellet, a KBNNO polished pellet, a KBNNO thin film on SrTiO$_3$ and a pure SrTiO$_3$ substrate. There are only two peaks at 600 cm$^{-1}$ and 800 cm$^{-1}$ that belong to the KBNNO thin film which coincide with the two peaks in the KBNNO pellet and resemble the modes in tetragonal KNbO$_3$. These two peaks correspond to the A$_1$ mode of TO and LO phonons in KNbO$_3$. As there are no more than two Raman peaks in the spectra, the tetragonal symmetry of the KBNNO thin film can be well established and a spontaneous polarization of KBNNO should be expected along the <001> direction.

Figure 12:
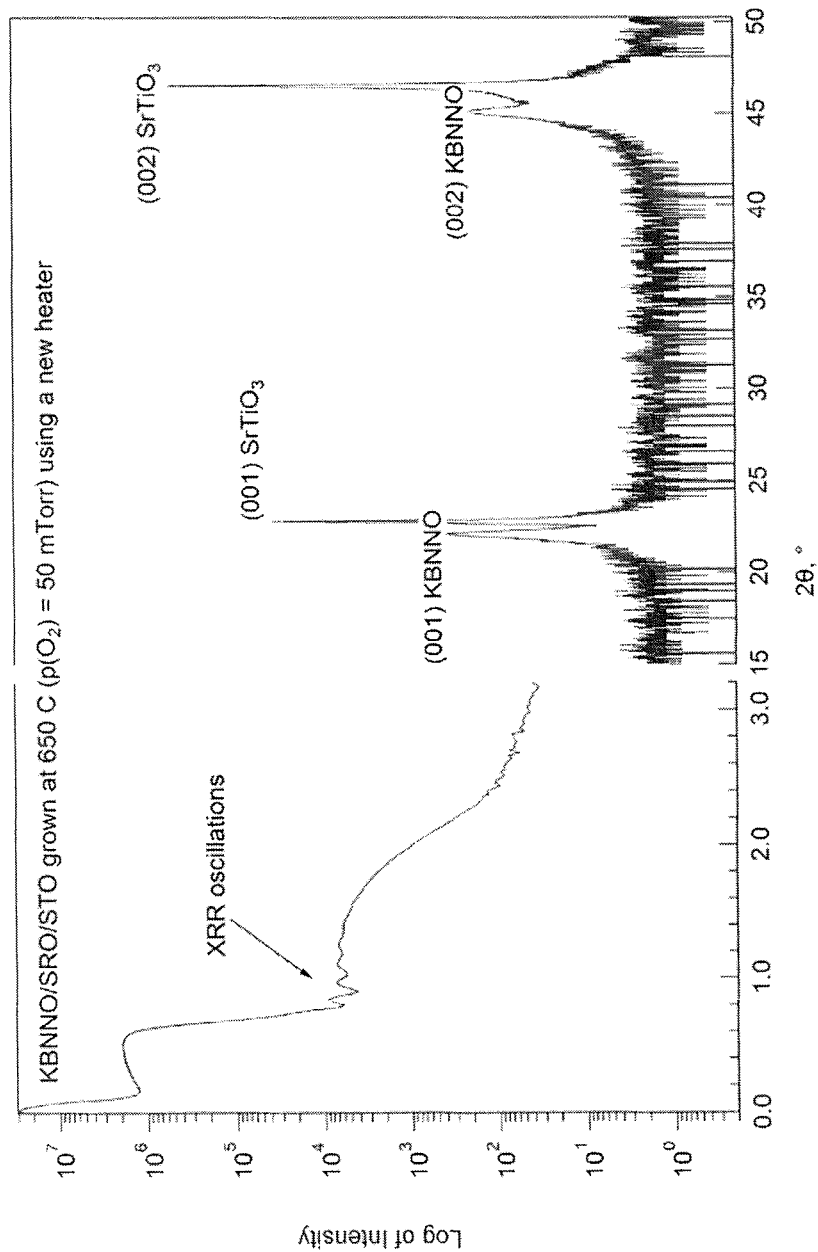
FIG. 12 shows an x-ray diffraction pattern of a KBNNO/SRO/STO heterostructure grown using a heater.

Improved heating equipment permits easier control of temperature and thus stoichiometry and quality of the grown thin films. In FIG. 12 the XRD data is shown for an optimized thin film grown using an improved heater. A highly crystalline KBNNO thin film is shown on the SRO/STO(001) substrate. The SRO sublayer is also supposed to be epitaxial, as in FIG. 9, where the thin film was grown using a heater without the ease of temperature control. The small thickness of SRO makes it difficult to distinguish between the KBNNO and STO peaks.

Figure 13:
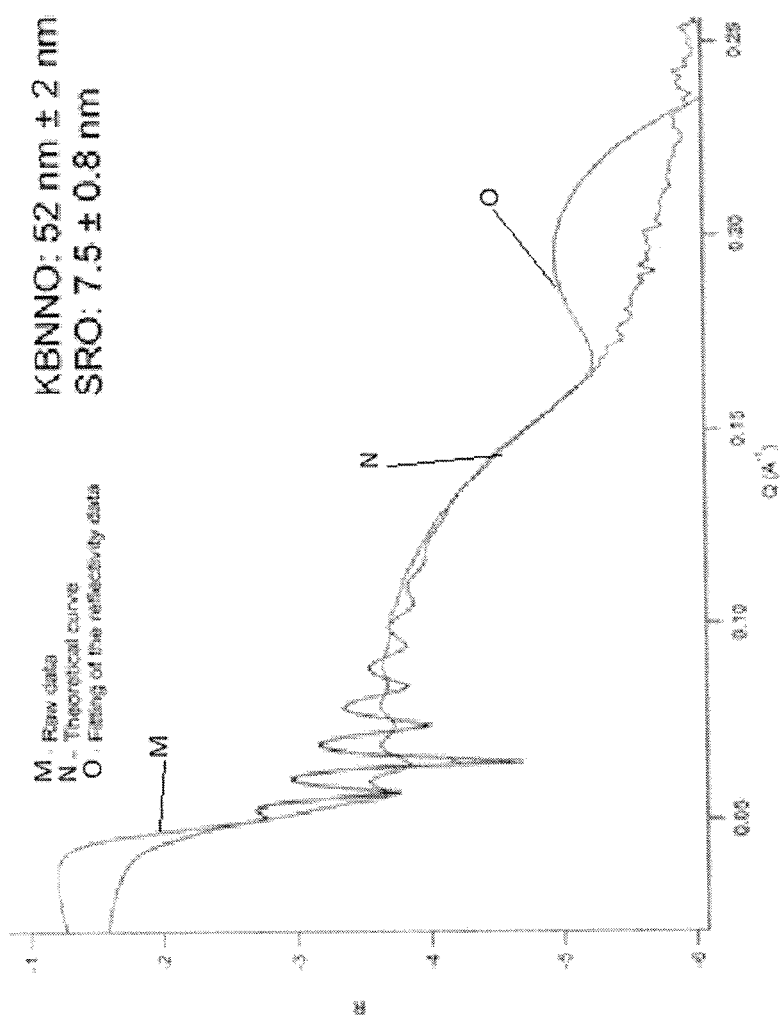
FIG. 13 shows fitted x-ray reflectivity data of the data shown in FIG. 12.
Figure 14:
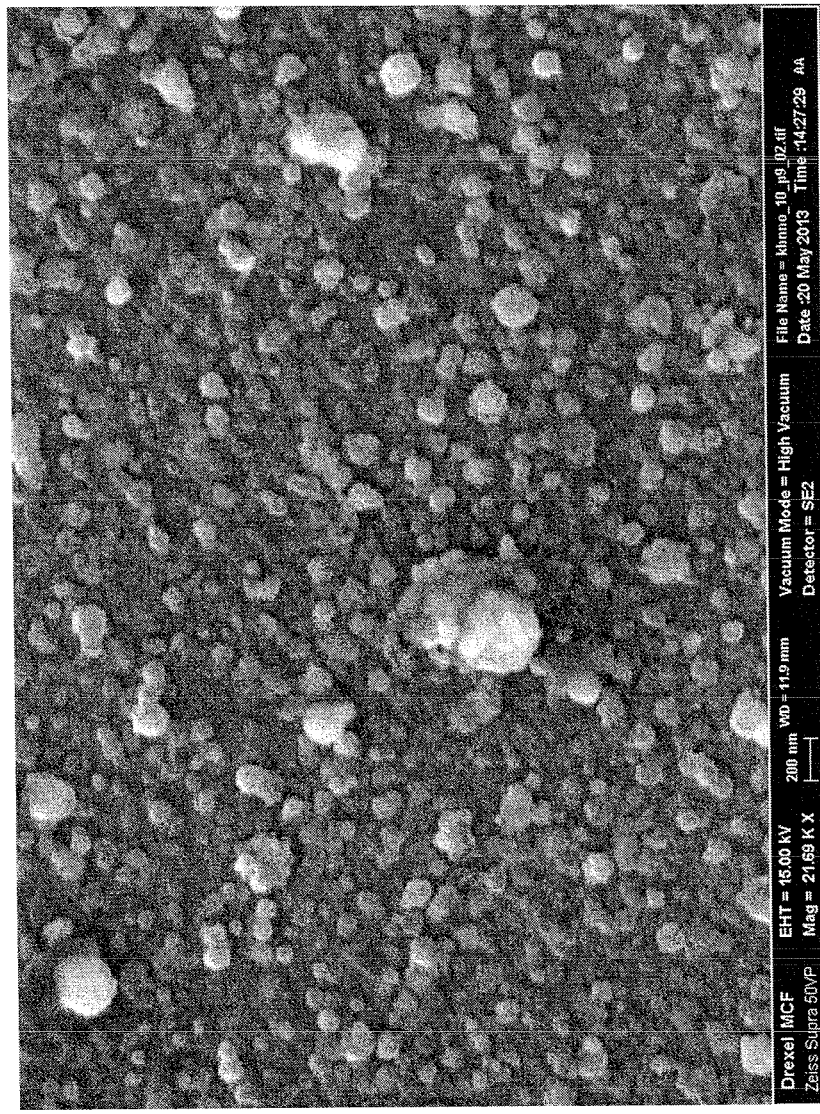
FIG. 14 is a scanning electron microscope image of a KBNNO thin film.

However, on the x-ray reflectometry (XRR) data shown in FIG. 13, where line M represents the raw data, line N represents the theoretical curve and line O represents the fitting of the reflectivity data, one can see both the oscillations from KBNNO, which correspond to ~50 nm thickness, damp very fast due to rather high roughness (few nm), and a SRO that is 7 nm thin and exhibits large-period oscillations. This is the first time XRR oscillations were observed from a KBNNO thin film, indicating that the conditions used for the growth of the thin film are very good. In FIG. 14 an SEM image shows the morphology of such a thin film, where grains/particles may be distinguished. Unfortunately, from such images the real roughness is not determinable and the white particles might be K-deficient phase (strongly dielectric), whose amount is much smaller than that of KBNNO and cannot be observed in the XRD pattern.

TABLE 1

| Element | Weight % | Atomic % |
|---|---|---|
| K K | 2.88 | 4.99 |
| Ta K | 31.62 | 44.80 |
| Ni K | 0.13 | 0.15 |
| Sr L | 57.86 | 44.81 |
| Nb L | 5.79 | 4.23 |
| Ru L | 0.95 | 0.64 |
| Ba L | 0.77 | 0.38 |

Table 1 shows the energy-dispersive X-ray analysis collected at 15 kV of the film obtained at optimized conditions using a new heater. K:Nb ratio is close to 1:1. Ni present was confirmed by later long-time collection of the spectrum. Ta impurity is the result of use of an impure precursor powder material.

It is to be understood, however, that even though numerous characteristics and advantages of the present invention have been set forth in the foregoing description, together with details of the method, composition and function of the invention, the disclosure is illustrative only, and changes may be made in detail, within the principles of the invention to the full extent indicated by the broad general meaning of the terms in which the appended claims are expressed.

What is claimed is:

1. A method of making a ferroelectric thin film for a photoelectric device comprising:
   forming a target comprising a step of mixing KNO$_3$, Nb$_2$O$_5$, NiO and BaO into a powder, prior to vaporizing the target
   vaporizing the target, and
   growing a thin film from the vaporized target on the surface of a substrate, wherein the grown thin film comprises a (1-x)KNbO$_3$-xBaNb$_{0.5}$Ni$_{0.5}$O$_3$ (KBNNO) material.

2. The method of claim 1, wherein the thin film is between 15 nm and 1 micron thick.

3. The method of claim 1, wherein the substrate has a temperature between 400 to 800° C.

4. The method of claim 1 wherein either the substrate is lattice mismatched with respect to the grown thin film or the substrate is glass.

5. The method of claim 1, wherein vaporization is performed using a laser.

6. The method of claim 1, wherein vaporization is performed using RF sputtering.

7. The method of claim 1, wherein forming the target further comprises;
   grinding the powder;
   pressing the ground powder; and
   annealing the pressed, ground powder.

8. The method of claim 1, wherein forming the target further comprises;
   ball-milling the powder;
   annealing the ball-milled powder;
   mixing the annealed powder with KNO$_3$ and pressing into pellets; and
   heating the pellets.

9. The method of claim 1, wherein the atmospheric pressure surrounding the substrate is between 0.1 mTorr to 75 mTorr.

10. The method of claim 1, wherein the substrate comprises a material selected from the group consisting of SrTiO$_3$, glass (SiO$_2$/Si(100)), DyScO$_3$, (La,Sr)(Al,Ta)O$_3$, MgO, ZrO$_2$, electrically conductive perovskite, metallic perovskite, Nb-doped SrTiO$_3$, electrically conductive film, metallic films, SrRuO$_3$, LaNiO$_3$ and non-perovskite oxides.

11. A method a making a photovoltaic cell comprising:
   forming a target comprising a step of mixing KNO$_3$, Nb$_2$O$_5$, NiO and BaO into a powder, prior to striking the target;
   striking the target with a laser beam;
   growing a thin film on the surface of a substrate using material from the struck target, wherein the material comprises (1-x)KNbO$_3$-xBaNb$_{0.5}$Ni$_{0.5}$O$_3$ (KBNNO); and
   forming a photovoltaic cell comprising the thin film.

12. The method of claim 11, wherein forming the target further comprises;
   grounding the powder;
   pressing the ground powder; and
   annealing the pressed ground powder.

13. The method of claim 11, wherein forming the target further comprises;
   ball-milling the powder;
   annealing the ball-milled powder
   mixing the annealed powder with KNO$_3$ and pressing into pellets; and
   heating the pellets.

14. The method of claim 11, wherein the thin film is between 15 nm and 1 micron thick.

15. The method of claim 11, wherein either the substrate is lattice mismatched with respect to the grown thin film or the substrate is glass.

16. A method of making a ferroelectric thin film for a photoelectric device comprising:
    forming a target comprising a step of mixing $KNO_3$, $Nb_2O_5$, NiO and BaO into a powder, prior to vaporizing the target,
    vaporizing the target having a stoichiometric excess of potassium, and
    growing a thin film from the vaporized target on the surface of a substrate, wherein the grown thin film comprises a $(1-x)KNbO_3\text{-}xBaNb_{0.5}Ni_{0.5}O_3$ (KBNNO) material.

17. The method of claim 16, wherein the substrate is either lattice mismatched with respect to the grown thin film or the substrate is glass.

18. The method of claim 16, wherein the substrate comprises a material selected from the group consisting of $SrTiO_3$, glass ($SiO_2$/Si(100)), $DyScO_3$, $(La,Sr)(Al,Ta)O_3$, $ZrO_2$, electrically conductive perovskite, metallic perovskite, Nb-doped $SrTiO_3$, electrically conductive film, metallic films, $SrRuO_3$, $LaNiO_3$ and non-perovskite oxides.

\* \* \* \* \*

UNITED STATES PATENT AND TRADEMARK OFFICE
CERTIFICATE OF CORRECTION

PATENT NO. : 10,749,056 B2
APPLICATION NO. : 15/430135
DATED : August 18, 2020
INVENTOR(S) : Peter K. Davies et al.

Page 1 of 1

It is certified that error appears in the above-identified patent and that said Letters Patent is hereby corrected as shown below:

On the Title Page

Item (73) should read:
Drexel University, Philadelphia, PA (US)
The Trustees of the University of Pennsylvania, Philadelphia, PA (US)

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*